Figure 1A:
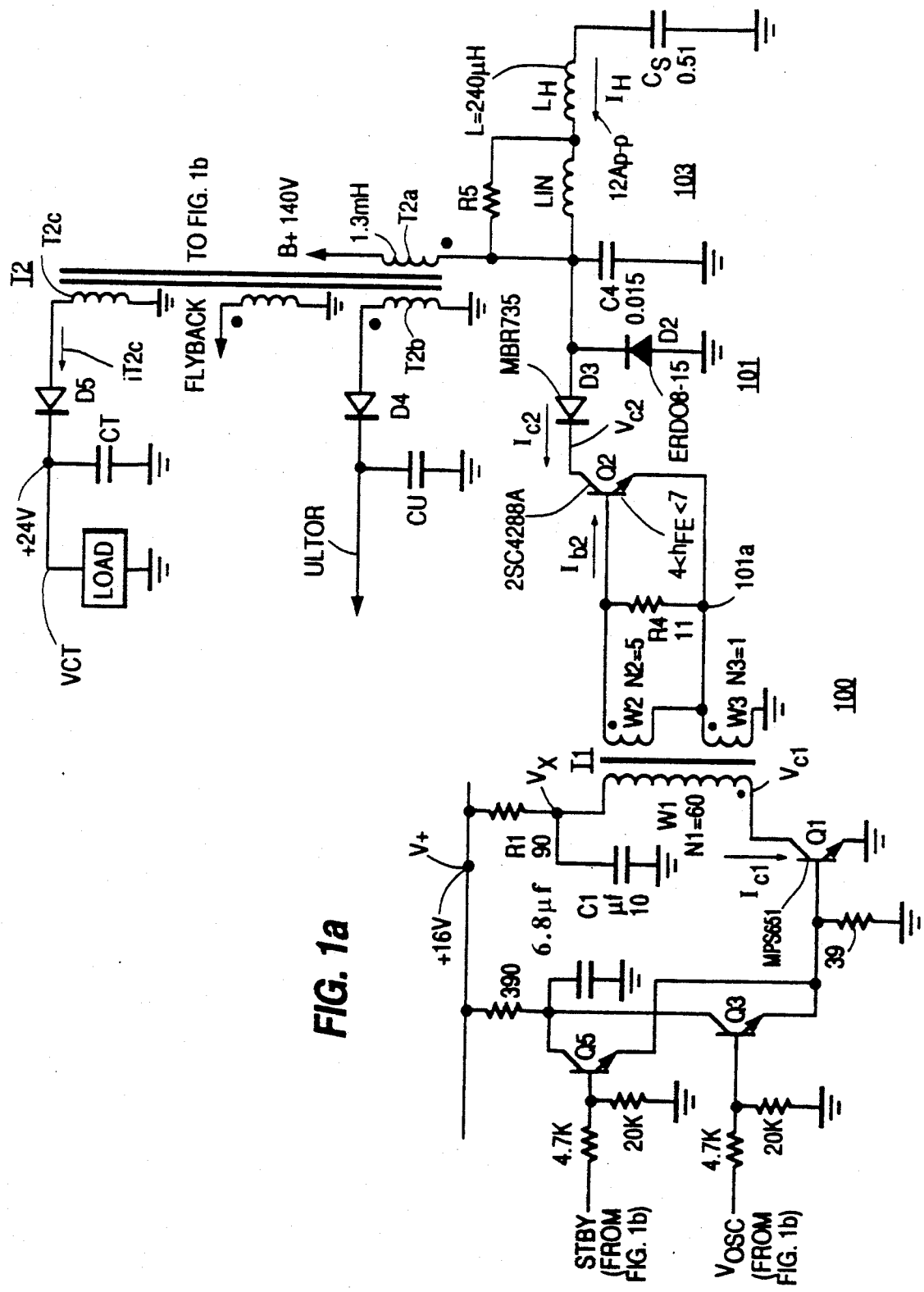

United States Patent [19]

Gries

[11] Patent Number: 5,142,206
[45] Date of Patent: Aug. 25, 1992

[54] SLOW TURN-ON IN A DEFLECTION CIRCUIT

[75] Inventor: Robert J. Gries, Indianapolis, Ind.

[73] Assignee: Thomson Consumer Electronics, Inc., Indianapolis, Ind.

[21] Appl. No.: 729,658

[22] Filed: Jul. 15, 1991

[51] Int. Cl.[5] ........................ G09G 1/04; H01J 29/70
[52] U.S. Cl. .................................... 315/408; 315/380
[58] Field of Search ................. 315/408, 380; 358/190

[56] References Cited

U.S. PATENT DOCUMENTS

| | | | |
|---|---|---|---|
| 3,956,669 | 5/1976 | Del Ciello | 315/411 |
| 4,323,825 | 4/1982 | Hayes | 315/387 |
| 4,396,948 | 8/1983 | Fernsler et al. | 358/158 |
| 4,692,853 | 9/1987 | Satre et al. | 363/49 |
| 4,868,662 | 9/1989 | Hartman et al. | 315/411 |

OTHER PUBLICATIONS

A Service Manual entitled RCA Color Television Basic Service Data CTC 115 Series, dated 1982, publ. by RCA Inc., Technical Publications Quebec, Canada, cover page & schematic p. 26.
A data sheet for IC MC 1391, made by Motorola.
A data sheet for IC CA1391 published by RCA Corporation.
A copending U.S. patent application, RCA Docket No. 85,536A, filed as a continuation patent application of the parent patent application, Ser. No. 481,426 entitled, A Deflection Driver in a Video Apparatus, in the name of Bruno E. Hennig.

*Primary Examiner*—Gregory C. Issing
*Attorney, Agent, or Firm*—Joseph S. Tripoli; Joseph J. Laks; Sammy S. Henig

[57] ABSTRACT

A horizontal oscillator, responsive to an on/off control signal, generates an output signal that is coupled via a driver stage to a control terminal of a horizontal deflection output transistor. During a transition interval that follows a standby mode of operation, the duty cycle of the oscillator output signal is reduced relative to when a run mode of operation occurs to provide soft-start operation.

10 Claims, 4 Drawing Sheets

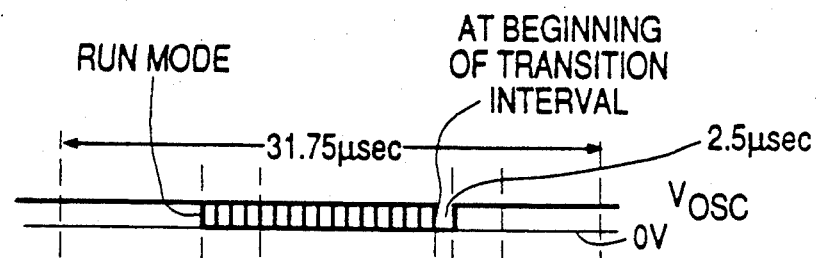
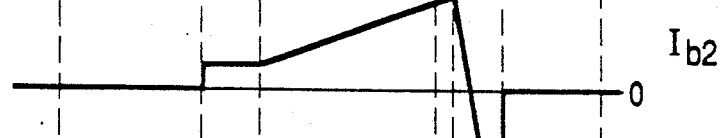
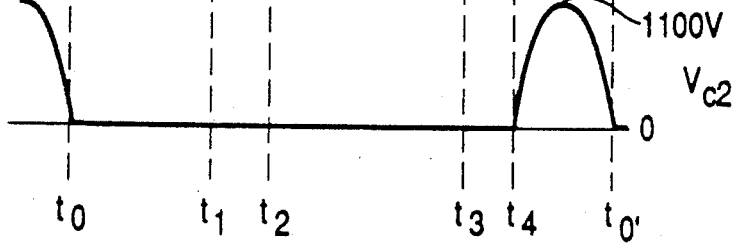

SLOW TURN-ON IN A DEFLECTION CIRCUIT

The invention relates to a deflection circuit of a cathode ray tube (CRT) in a television receiver or other such display device.

A typical horizontal deflection circuit that is used in various color television receivers includes a horizontal oscillator coupled via a driver or drive stage having a transformer coupled to a control terminal of an output transistor of a deflection circuit output stage. The driver stage further includes a coupling transformer having a primary winding and a secondary winding. During a portion of a trace interval of a given deflection cycle, stored magnetic energy in the coupling transformer produces, in a flyback manner, a winding current that flows in the secondary winding of the coupling transformer to form a forward base current in the output transistor. The forward base current drives the deflection output transistor into saturation.

In such horizontal deflection output stage, a deflection winding is coupled to a retrace capacitance to form a retrace resonant circuit, during a retrace interval of a deflection cycle. The horizontal output transistor is responsive to the current in the secondary winding of the coupling transformer, at a frequency related to a deflection frequency, developed from an output of the horizontal oscillator. The output transistor has a collector that is coupled to the retrace resonant circuit for generating a deflection current in the deflection winding. A primary winding of a flyback transformer is coupled between a B+ supply voltage and the collector of the output transistor. During a portion of the trace interval, the deflection current and the flyback transformer primary current flow in the collector of the output transistor.

As a result of switching operation in the output transistor, flyback pulse voltages, developed in secondary windings of the flyback transformer, are rectified and applied to filter capacitors to develop output supply voltages used to energize various stages of the television receiver.

In some prior art arrangements, to simplify the B+ power supply circuitry, the B+ supply voltage is generated both during standby and normal run modes of operation. To enable the switching operation in the output transistor, the current developed from the horizontal oscillator output and applied to the base of the output transistor is enabled under the control of an on/off control signal. The on/off control signal is provided from, for example, a remote control receiver in a manner to enable switching operation in the output transistor. Immediately prior to a transition interval, from the standby mode of operation to the normal run mode of operation, when the base current in the output transistor is still disabled, each of the filter capacitors is completely discharged. During flyback intervals within the transition interval, the discharged filter capacitors form a heavy load with respect to the flyback transformer.

Assume, hypothetically, that during the aforementioned transition interval, the output transistor were to conduct in each cycle interval, the same length of time as in the run mode of operation. This situation is referred to as conduction with a duty cycle that is greater than one half. In this case, the heavy load of the not yet fully charged filter capacitors might cause an excessive collector current in the output transistor, during the portion of each cycle when the output transistor is conductive. Such excessive collector current might damage the output transistor. It may be desirable to prevent such excessive current.

In one prior art driver stage, the driver transformer has a winding that is coupled in a current path of the collector current of the output transistor. In the portion of the cycle when the output transistor is conductive the collector current in the output transistor increases in an upramping manner. The upramping collector current is coupled via the coupling transformer back to the base of the output transistor in a positive feedback manner. The result is that an upramping base current is generated. Because of the positive feedback the collector current could increase even more than if no positive feedback is provided during the aforementioned transition interval. Therefore, when such positive feedback is utilized, it may be even more desirable to limit the collector current of the output transistor, during the transition interval.

A deflection circuit, embodying an aspect of the invention, includes a source of an input supply voltage that is developed at least during a transition interval that follows a standby mode of operation and during a run mode of operation. A supply inductance is coupled to the source of the supply voltage. A deflection winding is coupled to a retrace capacitance to form a retrace resonant circuit, during a retrace interval of a deflection cycle. A first control signal is generated at a frequency that is related to a deflection frequency. A first switching transistor responsive to the first control signal and coupled to the resonant circuit and to the supply inductance performs a periodic switching operation, during the transition interval and during the run mode of operation. A deflection current is generated in the deflection winding, and a flyback pulse voltage is generated in the supply inductance when the switching operation occurs. A duty cycle of the first switching transistor is controlled to substantially reduce the duty cycle during the transition interval relative to the duty cycle during the run mode of operation. Reduction of the duty cycle provides soft start operation such that excessive current in the first switching transistor is prevented during the transition interval.

Figure 1B:
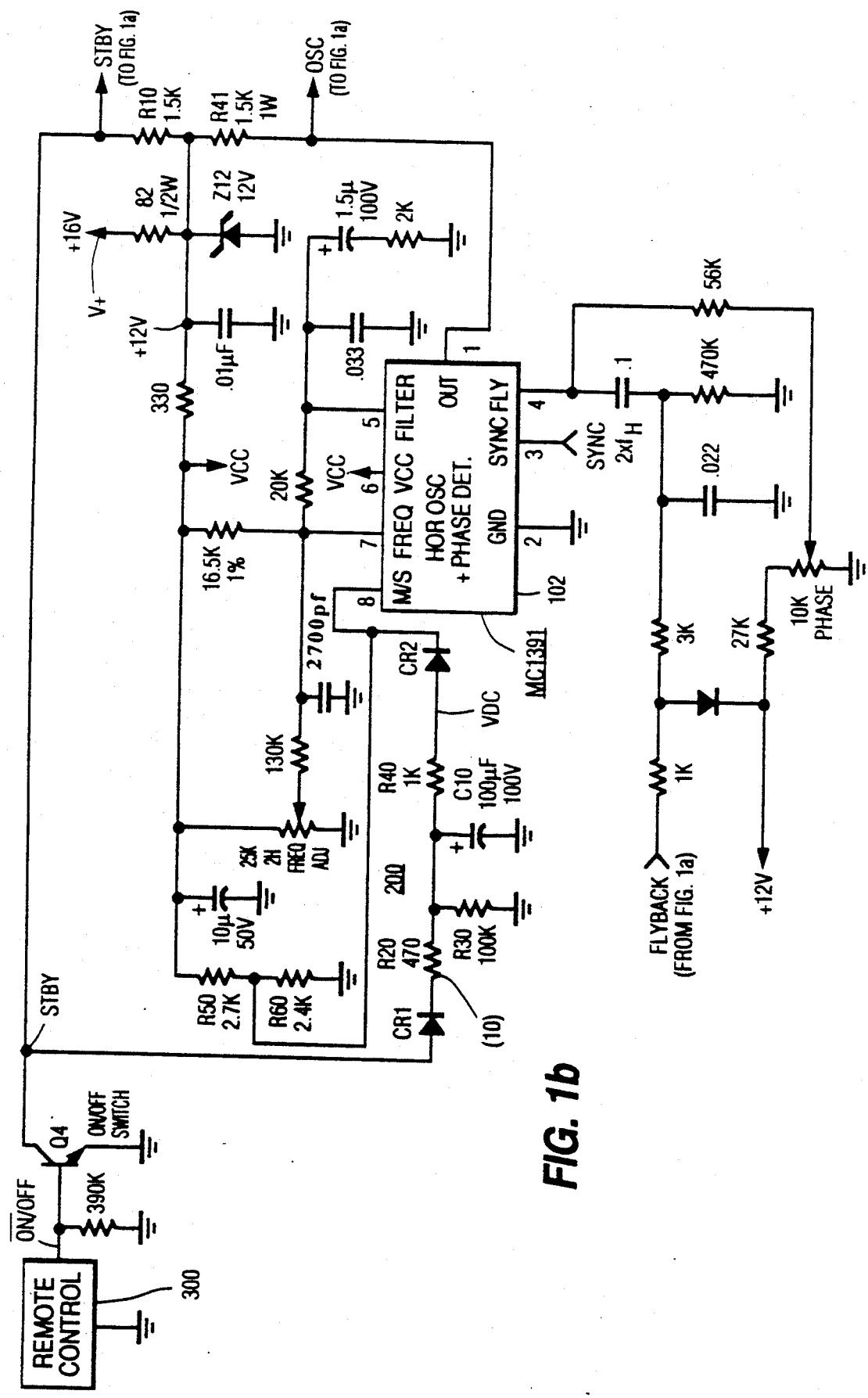

FIG. 1, formed by FIGS. 1a and 1b, illustrates a drive circuit, embodying an aspect of the invention, that drives a horizontal deflection circuit output transistor of an output stage;

FIGS. 2a-2d illustrate waveforms useful for explaining the operation of the circuit of FIG. 1 in normal operation and in start-up or transition interval; and FIGS. 3a-3d illustrate waveforms of a collector current of the output transistor of FIG. 1a during start-up under various conditions.

FIG. 1a illustrates a driver stage 100 for driving a switching output transistor Q2 of a horizontal deflection circuit output stage 101 of a television receiver. A horizontal oscillator, included in a phase-control-stage 102 of FIG. 1b, produces an output signal $V_{OSC}$. Signal $V_{OSC}$ is at a horizontal frequency of $2 \times f_H$ that is approximately 32 KHZ. Signal $V_{OSC}$ is coupled via an emitter follower transistor Q3 to a base electrode of a driver transistor Q1. Frequency $f_H$, that is about 16 KHZ, is the horizontal deflection frequency in, for example, the NTSC standard. Thus, frequency $2 \times f_H$ is substantially higher than 16 KHZ. The oscillator of stage 102 is controlled by an on/off control signal of FIG. 1b produced in a remote control receiver 300.

Signal on/off causes transistor Q1 of FIG. 1a to be continuously turned-on when signal on/off is at the "OFF" state, throughout standby mode of operation, in a manner that maintains transistor Q1 continuously conductive.

A collector of transistor Q1 of FIG. 1a is coupled to one end terminal of a primary winding W1 of a coupling transformer T1. The other end terminal of winding W1 is bypassed to ground by a filter capacitor C1 and coupled via a current limiting resistor R1 to a source of supply voltage V+ such that resistor R1 and capacitor C1 form a ripple filter. A secondary winding W2 of transformer T1 is coupled across a base-emitter junction of transistor Q2 and across a resistor R4. A junction terminal 101a that is coupled at a junction of winding W2, resistor R4 and the emitter of transistor Q2 is coupled to one end terminal of a winding W3 of transformer T1. The other end terminal of winding W3 is coupled to ground.

The collector of transistor Q2 is coupled in series with a diode D3 to a conventional damper diode D2 of a horizontal deflection circuit 103. Circuit 103 includes a horizontal deflection winding $L_H$, a retrace capacitor C4, a trace capacitor $C_S$, a linearity inductor LIN, and a snubber resistor R5 that are coupled in a well-known manner. Winding $L_H$ of FIG. 1a is representative of, for example, three horizontal deflection windings, not shown, coupled in parallel of three cathode ray tubes in a projection television receiver. Diode D3 prevents reverse collector current from flowing in transistor Q2 and in winding W2 or W3.

A supply voltage B+ is coupled to circuit 103 via a winding T2a of a horizontal flyback transformer T2. During retrace or flyback, circuit 103 forms a retrace resonant circuit that includes capacitor C4, winding $L_H$ and winding LIN. During flyback or retrace time, flyback pulse voltages are produced in various windings of transformer T2 to charge filter capacitors such as a capacitor CU, for producing supply voltages, such as a voltage ULTOR that is coupled to an ultor electrode. During trace time, circuit 103 forms a trace resonant circuit that includes trace capacitor $C_S$ and winding $L_H$ and a collector current Ic2 in winding T2a is upramping. During trace, transistor Q2 is conductive and a winding T2c develops a trace voltage that is coupled via a rectifier D5 to a capacitor CT. Rectifier D5 is conductive, during trace. A supply voltage of, for example, +24 V is developed in capacitor CT and applied to a load circuit within the receiver. To simplify power supply circuitry, voltages B+ and V+ are produced both in the standby and in the run mode operation in a conventional manner, not shown.

FIGS. 2a-2d illustrate idealized or approximated waveforms in solid lines useful for explaining the run mode operation of the circuit of FIGS. 1a and 1b. Waveforms in broken lines are related to a transition interval, from the standby mode to the run mode of operation. Similar symbols and numerals in FIGS. 1a, 1b and 2a-2d indicate similar items or functions.

In normal run mode operation, driver transistor Q1 of FIG. 1a is conductive as a result of signal $V_{OSC}$ of FIG. 2a being positive until time $t_1$ that causes transistor Q2 of FIG. 1a to be nonconductive. The magnetic energy supplied by a collector current $I_{c1}$ of transistor Q1 is stored in winding W1. When transistor Q1 is turned off, during interval $t_1$-$t_3$ of FIG. 2a, the stored energy produces in winding W2 of FIG. 1a a forward base current $I_{b2}$ of transistor Q2. Current $I_{b2}$ is sufficient to turn on deflection transistor Q2 and to maintain it in saturation prior to time $t_2$ of FIG. 2b.

The amplitude of current $I_{b2}$ remains substantially constant during a latter portion of the first half of trace, interval $t_1$-$t_2$. This is so because windings W2 and W3 of FIG. 1a are heavily loaded by the low impedance of the base-emitter junction of transistor Q2. At time $t_2$, a deflection current $I_H$ in deflection winding $L_H$ of FIG. 1a reverses polarity. As a result of current reversals in deflection winding $L_H$ of circuit 103 of FIG. 1 and in a flyback transformer winding T2a, collector current $I_{c2}$ starts flowing in transistor Q2 of FIG. 1a after time $t_2$ of FIG. 2c in an upramping manner.

Upramping collector current $I_{c2}$ that flows as an emitter current through winding W3 of FIG. 1a is transformer-coupled through current transformer T1 to the base of transistor Q2 in accordance with a turns ratio N2:N3 of windings W2 and W3, respectively. Transformer coupled current $I_{c2}$ provides a major portion of upramping forward base current $I_{b2}$ of transistor Q2, during the second half of trace, interval $t_2$-$t_3$, when collector current $I_{c2}$ is upramping. The base-emitter junction of transistor Q2 forms a very low impedance across winding W2. Therefore, a performance similar to that of an ideal current transformer operation is obtained in transformer T1 for coupling the current in winding W3 to winding W2. The required turn ratio between windings W2 and W3 is determined by the current gain $h_{FE}$ of transistor Q2. Current gain $h_{FE}$ is within a tolerance range of, for example, 4 and 7.

Upramping base current that is proportional to current $I_{c2}$ is induced in winding W2 of FIG. 1a only after time $t_2$ of FIG. 2b. Transformer coupled upramping current $I_{c2}$ of FIG. 2c is added to the aforementioned current already provided by the stored magnetic energy in transformer T1 of FIG. 1a to form upramping base current $I_{b2}$ of FIG. 2b. During interval $t_2$-$t_3$, base current $I_{b2}$ is produced mainly from current $I_{c2}$ of FIG. 2c. The rate of change of current $I_{b2}$ of FIG. 2b closely tracks the base current requirement of deflection transistor Q2 of FIG. 1a having upramping collector current $I_{c2}$ of FIG. 2c. Cut-off of transistor Q2 of FIG. 1a is initiated at time $t_3$ of FIG. 2c, when transistor Q1 of FIG. 1a is switched into saturation, as explained in a copending allowed U.S. Pat. Ser. No. 481,426 entitled, A DEFLECTION DRIVER IN A VIDEO APPARATUS, in the name of Bruno E. Hennig, that is incorporated by reference herein.

Signal on/off of FIG. 1b is coupled to a base of an on/off transistor switch Q4. A collector of transistor Q4 is coupled via a pull-up resistor R10 to a +12 volts voltage VCC developed in a zener diode Z12. The +12 volts voltage in zener diode Z12 is produced from voltage V+ both in standby and in the run modes of operation. In the standby mode of operation, when transistor Q4 is nonconductive, a collector voltage STBY of transistor Q4 is at approximately +9.5 volts. Therefore, transistor Q5 is conductive and turns on transistor Q1 throughout the standby mode of operation in a manner that prevents switching operation in transistor Q2.

Phase-control-stage 102 of FIG. 1, realized by, for example, a well known integrated circuit (IC) MC1391 made by Motorola Corporation, receives a synchronizing signal SYNC at the frequency $2 \times f_H$ from a conventional phase-lock-loop circuit, not shown, of a two-loop system that is synchronized by horizontal sync pulses obtained from a video detector, also not shown. Stage 102 also receives a feedback signal FLYBACK produced in transformer T2. Stage 102 produces signal OSC to form a phase-control-loop of the two-loop system.

A portion of a voltage VDC at a terminal M/S of IC MC 1391 is developed by a voltage divider formed by a resistor R50 coupled in series with a resistor R60. Voltage VDC at terminal M/S controls the duty cycle of signal OSC. The series coupled arrangement of resistors R50 and R60 is coupled between supply voltage VCC of +12 volts and ground to establish a duty cycle of signal OSC, that is greater than one half, during the run mode of operation. The duty cycle is defined by a ratio between the portion of a given cycle or period of signal OSC in which transistor Q2 is conductive to the entire length of the cycle. Voltage VCC is developed from supply voltage V+ by a zener diode Z12. Zener diode Z12 produces voltage VCC during both standby and run modes of operation that also energizes IC 1359 of stage 102.

An arrangement 200, embodying an aspect of the invention, that includes a diode CR1, a resistor R20, a resistor R40 and a diode CR2, coupled in series, couples voltage STBY, that is developed only during standby, to input terminal M/S of IC MC 1391 of stage 102. Consequently, duty cycle controlling voltage VDC at input terminal M/S is larger, or more positive than during normal run mode of operation.

When the signal on/off changes to its "ON" state to initiate the transition interval, voltage STBY becomes zero and transistor Q4 becomes conductive, causing inhibiting transistor Q5 of FIG. 1a to be nonconductive. Therefore, coupling of signal OSC to the base of transistor Q1 is enabled and switching operation is initiated in transistor Q2.

Prior to the beginning of the transition interval, the voltage at terminal M/S is greater than in the run mode and causes the duty cycle of signal OSC to be substantially smaller than 50%, such as 8%. A capacitor C10, that is charged by voltage STBY during standby, and a resistor R30 form a parallel arrangement of arrangement 200 that is coupled at a junction between resistors R20 and R40 of arrangement 200.

In carrying out an inventive feature, the duty cycle of signal OSC, at the beginning of the transition interval, is controlled by arrangement 200 to be substantially smaller, such as, for example, 8% than in normal run mode of operation. This is done in order to reduce a tendency of collector current Ic2 in transistor Q2 to become excessive during the transition interval. The tendency of the collector current of transistor Q2 to become excessive occurs because the filter capacitors and other capacitive loads, of which only capacitors CU and CT are shown, are completely discharged prior to the transition interval. Because, at the beginning of the transition interval, for example, filter capacitor CT is completely discharged, it, in effect, forms a short circuit with respect to transformer T2, until capacitor CT is charged. The result is that a current iT2c in winding T2c has a magnitude that is high, when transistor Q2 is initially turned on. Because of the tight coupling between windings T2c and T2a, the part of current Ic2 that flows in winding T2a increases at a high rate of change. If the duty cycle of transistor Q2 were significant, such as the same as in the run mode, the peak of current Ic2 could have become excessive such as 27A.

Because of the positive feedback via transformer T1 base current Ib2 can sustain a saturation state in transistor Q2 even at a very high collector current level. Advantageously, reducing the duty cycle of signal OSC by arrangement 200, during a portion of the transition interval, lessens the tendency of collector current in transistor Q2 to become excessive. Thus, by maintaining a significantly smaller duty cycle of signal OSC, during the transition interval, the filter capacitors are charged over a longer period and the peak collector current Ic2 is maintained at a magnitude that is smaller than 24A, the peak current that is permissible in transistor Q2. In comparison, current Ic2 is at a peak of 9.5 A, during the run mode. The result is that a soft start operation is obtained.

During the transition interval, capacitor C10 is decoupled from conducting transistor Q4 via diode CR1. Therefore, the capacitor is slowly discharged via resistor R30 in a manner to maintain sufficiently small duty cycle until the filter capacitors such as capacitor CT are charged. When the voltage across capacitor C10 decreases, voltage VDC at terminal M/S also decreases and the duty cycle of signal OSC and of transistor Q2 gradually increases. Advantageously, when the voltage in capacitor C10 decreases to a level that causes diode CR2 to become nonconductive, the voltage at terminal M/S is at its run mode level that is determined by resistors R50 and R60. Thus, in the run mode of operation, arrangement 200 has no effect on the duty cycle of signal OSC.

Each of FIGS. 3a–3d illustrates the waveform of collector current Ic2 of FIG. 1a, during the first and subsequent cycles in the transition interval, immediately after signal on/off changes to its "ON" state, under operating conditions that are explained below.

Figure 3A:
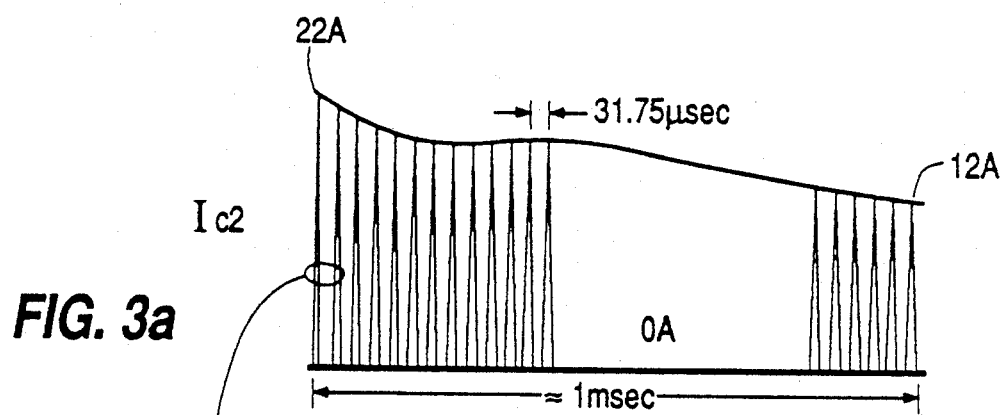
Figure 3B:
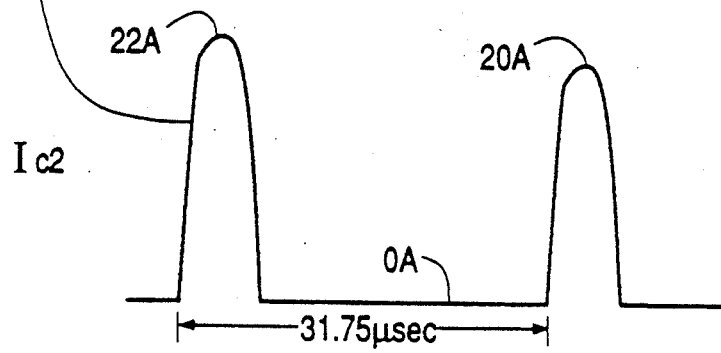

The waveforms of FIGS. 3a and 3b are obtained when the value of resistor R2 is 470Ω, as shown in FIG. 1b without parenthesis. In this case, to provide soft start operation, the aforementioned duty cycle of 8% of signal OSC is obtained at the beginning of the transition interval.

Figure 3C:
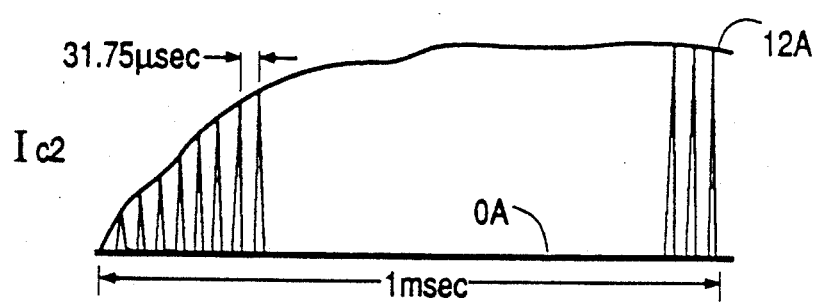

The waveform of FIG. 3c is obtained when the value of resistor R2 is 10Ω instead of 470Ω, as shown in parenthesis in FIG. 1b. The result is that the duty cycle of current Ic2 of FIG. 3d increases gradually from a value that is substantially smaller. In such arrangement, signal OSC of FIG. 1b is not generated, during standby. The result is that the peak of current Ic2, that is 12A, is even smaller than the 22A value obtained when resistor R2 is 470Ω.

Figure 3D:
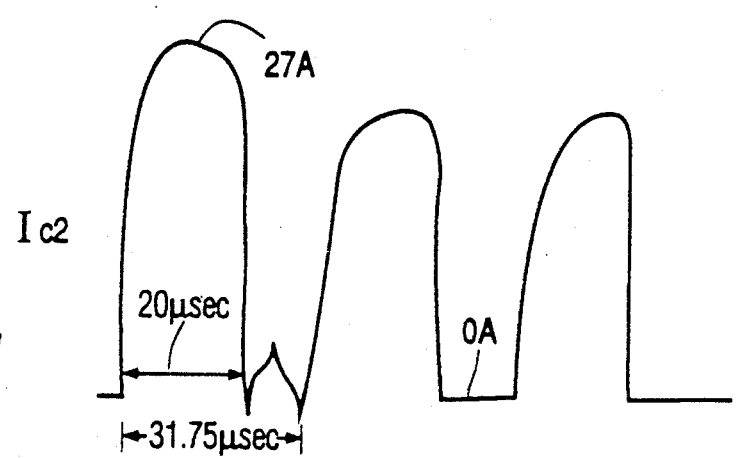

The waveform of FIG. 3d would be obtained if diode CR2 of FIG. 1b were removed, so as to eliminate the soft start feature. The result is that peak current Ic2, that is 27A is disadvantageously, excessive and its duty cycle is greater than 50%, during the transition interval.

I claim:

1. A deflection apparatus of a video display apparatus, comprising:
    a source of an input supply voltage that is developed at least during a transition interval that follows a standby mode of operation and during a run mode of operation;
    a supply inductance coupled to said source of said supply voltage;
    a deflection winding coupled to a retrace capacitance to form a retrace resonant circuit, during a retrace interval of a deflection cycle;
    means for generating a first control signal at a frequency that is related to a deflection frequency;
    a first switching transistor responsive to said first control signal and coupled to said resonant circuit and to said supply inductance for performing a periodic switching operation, during said transition interval and during said run mode of operation, to generate a deflection current in said deflection winding, and a flyback pulse voltage in said supply inductance when the switching operation occurs, said first switching transistor having a pair of main current conducting terminals that are coupled in a current path of said deflection current; and means responsive to an on/off control signal and coupled to said first switching transistor for controlling a duty cycle of said first switching transistor to substantially reduce said duty cycle during said transition interval relative to said duty cycle during said run mode of operation for providing soft start operation such that excessive current in said first switching transistor is prevented during said transition interval.

2. An apparatus according to claim 1 further comprising, a driver transformer having a first winding that is coupled to a control terminal of said first switching transistor and a second winding responsive to a signal produced by said first switching transistor for developing a ramping portion of said first control signal in a positive feedback manner with respect to the current in a main current conducting terminal of said first switching transistor.

3. An apparatus according to claim 2 wherein said first control signal generating means comprises a second switching transistor responsive to a synchronizing signal at a frequency that is related to said deflection frequency and having a main current conducting terminal that is coupled to a third winding of said driver transformer for generating a switching current in said third winding that is transformer coupled via said driver transformer to a control terminal of said first switching transistor to control the switching in said first switching transistor.

4. An apparatus according to claim 1 wherein said supply inductance comprises a first winding of a flyback transformer and wherein said flyback pulse voltage is transformer coupled via a second winding of said flyback transformer to a rectifier, said rectifier rectifying said flyback pulse voltage for developing in a load circuit an output supply voltage.

5. An apparatus according to claim 4 wherein said load circuit includes a capacitive load that is discharged during said standby mode of operation such that, during said transition interval, said discharged capacitive load forms a heavier load than during said run mode of operation that causes a tendency of said current in said first switching transistor to become excessive and wherein said duty cycle controlling means lessens said tendency of said current in said main current conducting terminal of said first switching transistor to become excessive by reducing said duty cycle, during said transition interval.

6. An apparatus according to claim 1 wherein said duty cycle controlling means is coupled to said first control signal generating means to cause a duty cycle of said first control signal to become smaller during said transition interval than during said run mode of operation.

7. A deflection apparatus of a video display apparatus, comprising:

a source of an input supply voltage that is developed at least during a transition interval that follows a standby mode of operation and during a run mode of operation;

a supply inductance coupled to said source of said supply voltage;

a deflection winding coupled to a retrace capacitance to form a retrace resonant circuit, during a retrace interval of a deflection cycle;

means for generating a first control signal at a frequency that is related to a deflection frequency;

a first switching transistor responsive to said first control signal and coupled to said resonant circuit and to said supply inductance for performing a periodic switching operation, during said transition interval and during said run mode of operation, to generate a deflection current in said deflection winding, and a flyback pulse voltage in said supply inductance when the switching operation occurs; and means responsive to an on/off control signal and coupled to said first switching transistor for controlling a duty cycle of said first switching transistor to substantially reduce said duty cycle during said transition interval relative to said duty cycle during said run mode of operation for providing soft start operation such that excessive current in said first switching transistor is prevented during said transition interval wherein said duty cycle controlling means comprises a capacitor that develops a capacitor voltage, during said standby mode of operation, said capacitor voltage varying in a given direction, during said transition interval and being coupled to said first control signal generating means to control a duty cycle of said first control signal in accordance with a magnitude of said capacitor voltage such that at an end of said transition interval, after said capacitor voltage attains a predetermined magnitude, said duty cycle is no longer by said capacitor.

8. A deflection apparatus of a video display apparatus, comprising:

a source of an input supply voltage that is developed at least during a transition interval that follows a standby mode of operation and during a run mode of operation;

a supply inductance coupled to said source of said supply voltage;

a deflection winding coupled to a retrace capacitance to form a retrace resonant circuit, during a retrace interval of a deflection cycle;

means for generating a first control signal at a frequency that is related to a deflection frequency;

a first switching transistor responsive to said first control signal and coupled to said resonant circuit and to said supply inductance for performing a periodic switching operation, during said transition interval and during said run mode of operation, to generate a deflection current in said deflection winding, and a flyback pulse voltage in said supply inductance when the switching operation occurs, said first switching transistor having a pair of main current conducting terminals that are coupled in a current path of said deflection current; and means responsive to an on/off control signal for generating a second control signal that is coupled to said first control signal generating means to control a duty cycle of said first switching transistor in a manner that substantially reduces said duty cycle during said transition interval, when said second control signal is at a first level, relative to said duty cycle during said run mode of operation, when said second control signal is at a second level.

9. An apparatus according to claim 8 wherein said second control signal generating means is decoupled from said first control signal generating means throughout said run mode of operation.

10. An apparatus according to claim 8 wherein said second control signal generating means comprises switching means for coupling a first voltage to a terminal of said first control signal generating means, during said transition interval, for decoupling said first voltage from said terminal, during said run mode of operation and for coupling a second voltage to said terminal of said first control signal generating means during at least said run mode of operation.

* * * * *